United States Patent [19]

Lezan

[11] 4,400,755
[45] Aug. 23, 1983

[54] OVERVOLTAGE PROTECTION CIRCUIT

[75] Inventor: Georges R. E. Lezan, Roanoke, Va.

[73] Assignee: General Electric Company, Salem, Va.

[21] Appl. No.: 284,070

[22] Filed: Jul. 16, 1981

[51] Int. Cl.³ .......................... H02H 3/20; H02H 9/04
[52] U.S. Cl. .......................................... 361/91; 363/54
[58] Field of Search ................ 361/91, 90, 86, 100, 361/101, 110, 111; 363/54, 57

[56] References Cited

U.S. PATENT DOCUMENTS

| | | |
|---|---|---|
| 3,502,910 | 3/1970 | Johnson-Brown . |
| 3,611,106 | 10/1971 | Mooney et al. . |
| 3,654,542 | 4/1972 | Champit . |
| 3,654,543 | 4/1972 | Isogai . |
| 3,662,248 | 5/1972 | Amano . |
| 3,662,250 | 5/1972 | Piccone et al. . |
| 3,794,908 | 2/1974 | Lindblom et al. ............... 340/645 X |
| 3,865,438 | 2/1975 | Boksjo et al. .......................... 363/54 |
| 3,881,147 | 4/1975 | Ueda et al. ............................ 363/57 |
| 3,938,026 | 2/1976 | Hoffmann et al. . |
| 4,013,925 | 3/1977 | Tice et al. ........................... 361/91 X |
| 4,084,206 | 4/1978 | Leowald et al. ....................... 363/54 |
| 4,084,221 | 4/1978 | Ogata . |
| 4,237,509 | 12/1980 | Asplund ............................ 361/91 X |
| 4,320,445 | 3/1982 | Kobayashi et al. .................... 363/54 |

FOREIGN PATENT DOCUMENTS

| | | |
|---|---|---|
| 1028107 | 5/1966 | United Kingdom ................... 363/54 |
| 1126989 | 9/1968 | United Kingdom . |
| 1203955 | 9/1970 | United Kingdom . |

Primary Examiner—Reinhard J. Eisenzopf
Attorney, Agent, or Firm—Arnold E. Renner; Ormand R. Austin

[57] ABSTRACT

An overvoltage protection circuit for a circuit array including one or more semiconductor devices such as thyristors derives its energization solely from the voltage across the array. A unidirectional current is developed to respond to that voltage and this current is utilized to develop an electrical charge of not more than a predetermined magnitude. The unidirectional current is also utilized to develop a signal which is proportional to the voltage across the array. When this signal reaches a predetermined level, indicative of an overvoltage condition of the array, a switching current is rendered operative to cause the stored charge to be applied to the gating electrodes of the array semiconductor devices to thereby render each such device conductive.

9 Claims, 1 Drawing Figure

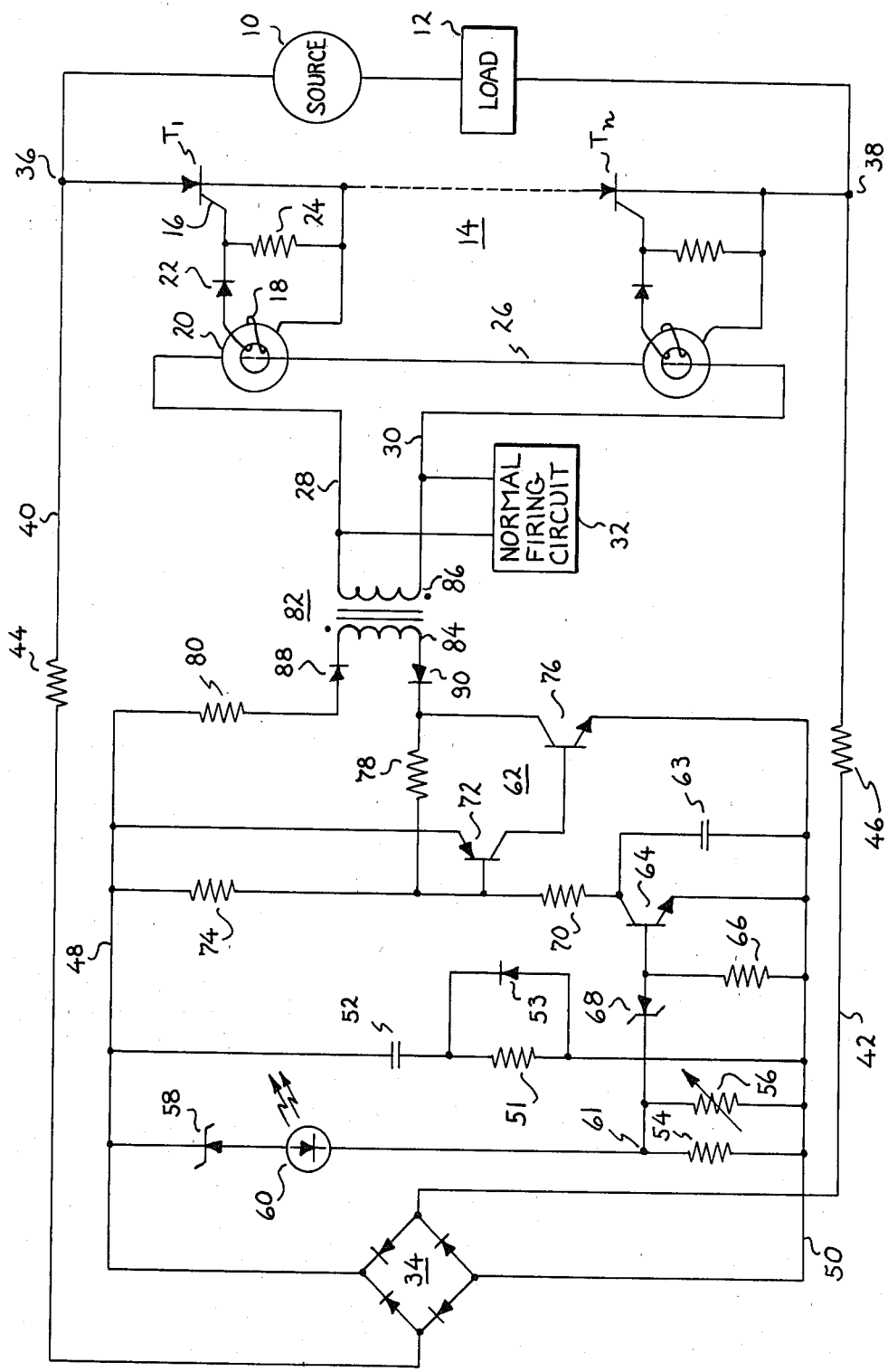

OVERVOLTAGE PROTECTION CIRCUIT

BACKGROUND OF INVENTION

The present invention relates generally to protective circuits and, more particularly, to overvoltage protection circuits for semiconductor devices such as thyristors which have the capability of being rendered conductive by the simultaneous application of a forward bias voltage and a gating signal applied to a gating electrode of the semiconductor device.

Many semiconductor devices, including thyristors, are susceptible to severe damage if too great a voltage is placed across their anode and cathode terminals. It is known that damage due to such overvoltage can often be prevented if the thyristor is rendered conductive with the attendant reduction in anode to cathode voltage.

It is also known that when the overall voltage to be utilized exceeds the capability of a single device, plural devices may be connected in series; i.e., in a "string". When such series connections are employed, it is necessary that all devices of the string be "fired" (i.e., rendered conductive) simultaneously. One known method of achieving this simultaneous conduction is to employ a plurality of torodial transformer cores (one per device) with the transformer secondaries respectively connected to supply the firing signals to the individual devices. A single turn primary winding is serially passed through each of the cores. Examples of this general technique are found in U.S. Pat. No. 3,654,542 (Apr. 4, 1972) and United Kingdom Pat. No. 1,126,989 (Sept. 11, 1968). Other showings of this concept are also available.

Whether a single semiconductor device or a string of such devices is used, collectively referred to as an array, as indicated above the rendering conductive of the array is an effective means for preventing overvoltage damage to the devices so long as all of the devices of the array are simultaneously rendered conductive. The provision of this protective function, however, presents certain problems since such a protection circuit must be reliable and yet, in a practical commercial sense, economical. The inclusion of such items as separate power supplies and elaborate sensing circuits tend to diminish reliability and increase cost. Additionally, in the event of failure of the normal means of rendering the array conductive, the array devices should be protected against an overvoltage condition.

SUMMARY OF THE INVENTION

It is, therefore, an object of the present invention to provide an improved overvoltage protection circuit for a semiconductor device.

It is a further object to provide an overvoltage protection circuit for a semiconductor device array which is simple in construction and economical to produce.

An additional object is to provide an overvoltage protection circuit for a semiconductor device array which is self contained in the sense that the source of power for the circuit is the voltage across the array.

The foregoing and other objects are achieved in accordance with the present invention by providing, with respect to a semiconductor circuit array, a unidirectional current source which is connected across the array for producing a unidirectional current as a function of the instantaneous voltage existing across the array. A charge storage means is adapted to receive the unidirectional current and to develop a charge thereon. The charge on the storage means is limited to a preselected value which is sufficient for developing a pulse to render the devices of the array conductive and additional means, responsive to the unidirectional current, is employed to develop a control signal proportional thereto. Switching means, responsive to a predetermined magnitude of the control signal, is effective to discharge the storage means to thereby generate a gating signal for application to the gate electrodes of each semiconductor device of the array, thereby rendering each such device conductive.

A BRIEF DESCRIPTION OF THE DRAWINGS

While the present invention is described in particularity in the claims annexed to and forming a part of this specification, a better understanding of the invention can be had by reference to the following description taken in conjunction with the accompanying drawing in which the single FIGURE is a schematic diagram illustrating the present invention in its preferred embodiment.

DETAILED DESCRIPTION

Referencing now the FIGURE, it is seen that a source of electrical power 10, which may be either AC or DC, as required, is connected to a suitable load 12 by way of a circuit array 14 which consists of one or more semiconductor devices. The purpose of the array 14 is to control the amount of power supplied from the source 10 to the load 12, all in a manner known in the art. As illustrated in the FIGURE, the array 14 is comprised of a plurality of series connected semiconductor devices such as thyristors $T_1$ through $T_n$ to form a "string". Typically, six such series connected thyristors would be included in a string. Each of the thyristors includes an anode, a cathode and a gating electrode (indicated at 16). In the illustrated embodiment, gating pulses are applied to the thyristor $T_1$ from the secondary winding 18 of a transformer having a torodial core 20. One end of the secondary winding 18 is connected to the cathode of the transistor while the other end is connected by way of a diode 22 to the gating electrode 16. A resistor 24 is connected between the cathode of the diode 22 and the cathode of the transistor $T_1$. That depicted is a typical type of firing circuit used in these types of applications and only that which is associated with thyristor $T_1$ has been described in detail, it being understood that each firing circuit for each device in the string will be identical. (It is noted that, since they play no part in the present invention, ancillary components such as snubber circuits which would normally be included with respect to each of the thyristors have been omitted.) A primary winding 26, for each of the torodial cores 20, is shown as a single turn passing through the cores and connected by way of lines 28 and 30 to a normal firing circuit 32. Firing circuit 32 may be any of those suitable for the intended application of the overall circuit and details of that circuit has not been included. Suffice it to say for present purposes that circuit 32 will provide suitable gating pulses by way of leads 28 and 30 to the primary winding 26 to thereby cause the gating pulses to be applied to the thyristors of the circuit array. As such, if there exists at the time of the gating pulse a forward voltage bias on those thyristors, they will conduct and power will be supplied from the source 10 to the load 12. The description thus far has been for environmental purposes as typical of those which are well known in the art.

The remaining portion of the FIGURE shows the overvoltage protection circuit of the present invention. A source of unidirectional current 34, illustrated as a simple diode rectifying bridge, is connected to nodal points 36 and 38 of the circuit array 14 by way of lines 40 and 42 within which are respectively included scaling resistors 44 and 46. Nodal points 36 and 38 are the termination points of the circuit array 14 and there will exist between these two points a voltage which is equal to the instantaneous voltage across the array 14. As such, the unidirectional current output of the source 34 which appears on buses 48 and 50 will be proportional to the instantaneous voltage existing between points 36 and 38.

A charge storage means, shown as a capacitor 52, is connected in series with a parallel connection of a resistor 51 and a diode 53 between buses 48 and 50. Thus, with the appearance of a voltage between points 36 and 38 current will flow from the source 34 and via bus 48 through capacitor 52 and resistor 51 to charge capacitor 52 in the positive direction at its upper plate. The rate of this charging will depend upon magnitude of the voltage across the thyristors and it is noted that the voltage contributing to this charging will be the voltages both when the circuit array 14 is in the connective state and when it is in the blocking state.

A circuit for limiting the charge stored on the capacitor 52 is connected, in a basically parallel relationship with capacitor 52, between bus 48 and a node 61 at the juncture of two parallel connected resistors 54 and 56 the other ends of which are connected to bus 50. This circuit includes a Zener diode 58 as a limiting means and an indicator 60 which may be, for example, a light emitting diode. Zener diode 58 may be a single diode or a plurality of series connected diodes to provide a suitable voltage level such as, for example, 70 volts. When the combined voltage on capacitor 52 and across resistor 51 reaches a value corresponding to the reverse breakdown voltage of diode 58, that diode will begin to conduct and the basic current path will be via diode 58, indicator 60 and the two resistors 54 and 56. Indicator 60 is included merely to show that suitable indicating means can be included in a relatively simple manner to indicate that the capacitor 52 has sufficient charge to achieve its function to be described.

The parallel combination of resistors 54 and 56 comprises means to develop a signal which is proportional to the unidirectional current. While two such resistors are shown (resistor 56 is shown to be variable) it is to be expressly understood that this particular implementation was to improve the resolution of this circuitry, that such a particular configuration is not necessary and that a single resistor could be employed with adequate results. The variable resistor 56 is for purposes of circuit adjustment. Thus, it is seen that at node 61 there will appear a control signal which is proportional to the direct current emanating from the source 34 which in turn is representative of the voltage across the circuit array 14.

A suitable switching means, indicated generally at 62, is provided to discharge capacitor 52 to thereby generate gating pulses for the devices of the array 14 whenever the voltage existing between points 36 and 38 exceeds a safe value. As illustrated, circuitry 62 includes a first transistor 64 having its emitter connected to the bus 50 and its collector connected by means of series combination of resistors 70 and 74 to the positive bus 48. The collector of transistor 64 is also connected to bus 50 by way of a capacitor 63 which capacitor tends to lengthen the duration of the signal current through resistor 70. The base of transistor 64 is connected to the bus 50 by way of a resistor 66 and is further connected by way of a second Zener diode 68 to node 61. A second transistor 72 has its base connected to the junction point of resistors 70 and 74, its emitter connected to bus 48 and its collector connected to the base of a third transistor 76 which, in turn, has its emitter connected to bus 50. The collector of transistor 76 is first connected by way of a series combination of a resistor 78 and the resistor 74 to the bus 48 and is also connected to that bus by way of resistor 80, diode 88, primary winding 84 of a transformer 82 and a second diode 90. Transformer 82 has a secondary winding 86 which is connected to the lines 28 and 30 which supply the primary 26 of the pulse transformers which serve to provide the gating signals to the thyristors of the array 14.

The operation of the overvoltage protection circuit is substantially as follows. As earlier indicated, unidirectional current emanating from the source 34 will serve to place the charge on capacitor 52. When the voltage on capacitor 52 reaches a predetermined value, diode 58 begins to conduct in the reverse direction such that there appears, at node 61, a control signal which is proportional to DC current which, as earlier indicated, is proportional to the voltage between the points 36 and 38. When the voltage between points 36 and 38 is within acceptable limits, the control signal at node 61 will be of a relatively low value such that all three transistors 64, 72 and 76 are non-conductive. Transistor 64 will be held non-conductive by the low voltage at its base by virtue of the connection via resistor 66. When, however, the voltage between points 36 and 38 reaches a value which may be harmful to the devices of the array 14, this is reflected by the voltage at node 61 and Zener diode 68 will now begin to conduct in the reverse direction. (A typical value of this might be approximately 6.2 volts.)

With conduction of Zener diode 68, the voltage at node 61 appears at the base of transistor 64 and that transistor will begin to conduct providing a collector-emitter current via resistors 70 and 74 between the buses 48 and 50. (As earlier indicated, capacitor 63 sustains conduction of that transistor for a period of time sufficient to transistors 72 and 76 to attain full conduction as next explained.) The conduction of transistor 64 will cause the voltage at the base of transistor 72 to drop, rendering that transistor conductive which in turn, by virtue of its connection to the base of transistor 76, will cause transistor 76 to conduct. When transistor 76 conducts, a path is established such that the charge existing on capacitor 52 will dissipate causing current to flow via the path including resistor 80, diode 88, transformer primary winding 84, diode 90 and the collector-emitter circuit of transistor 76. This current will create a pulse which is transformed to appear at the secondary 86 of transformer 82 to thus provide a gating pulse to the primary winding 26 of the pulse transformers 20 associated with the gating circuit array 14 to thus render the thyristors $T_1$-$T_n$ conductive.

In addition to the current path just described which provides the gating pulses, there exists a second current path from bus 48 which includes resistors 74 and 78 and the collector-emitter circuit of transistor 76. This current path constitutes a latching circuit to provide a holding current for transistor 76 to help maintain that transistor in conduction for sufficient length of time to permit an adequate gating pulse on primary winding 26. This time may be, for example, approximately eight microseconds. It is seen that without this holding path the voltage at node 61 might decrease to a point to cause the transistors of the switching network to turn off at an earlier period of time than would be desirable for providing adequate gating pulses. When the charge on capacitor 52 diminishes and the holding current therefore diminishes, the switching network 62 will return to its non-conducting state but by this time a pulse has been provided to fire each of the thyristors of the circuit array 14, thus rendering each of those thyristors conductive and reducing the anode to cathode voltage across each thyrisor of array 14 to a safe value.

As a final word of explanation, the diodes 88 and 90 which are in the circuit earlier described are provided and poled to prevent or to block the normal gating pulses originating in the firing circuit 32 from being reflected into the overvoltage protection circuit of the present invention.

Thus, it is seen that there has been described a simple and self-contained overvoltage protection circuit which will serve to protect the semiconductor devices of the circuit array 14 from overvoltage damage. It is recognized that there is a short period in the beginning of operation before a suitable charge is built upon 52 when there is not complete protection, but this is normally the period of current buildup when such protection is not usually necessary.

While there has been shown and described what is at present considered to be the preferred embodiment of the present invention, modifications thereto will readily occur to those skilled in the art. For example, while the particular transistor switching network disclosed is one embodying three transistors, it is obvious that other forms of switching networks could be used with equal facility. It is not desired, therefore, that the invention be limited to the specific circuits shown and described and it is intended to cover in the appended claims all such modifications as fall within the true spirit and scope of the invention.

What is claimed is:

1. An overvoltage protection circuit for a circuit array comprised of one or more semiconductor devices each having anode, cathode and gate electrodes, said array being connected intermediate a source of electrical power and a load and serving, upon the application of gating pulses to the gate electrodes, to deliver electrical power from the source to the load, said overvoltage protection circuit comprising:
   (a) means to provide a unidirectional current proportional to the instantaneous voltage across the array;
   (b) change storage means responsive to said unidirectional current to develop an electrical charge of a predetermined magnitude;
   (c) means responsive to said unidirectional current to develop a signal proportional to the instantaneous voltage across the array; and,
   (d) switch means, responsive to said signal, operative to discharge said charge storage means to thereby develop a firing signal for rendering each device of the array conductive.

2. The invention in accordance with claim 1 wherein said charge storage means includes a capacitor.

3. The invention in accordance with claim 2 wherein said switch means includes;
   (a) a cascade arrangement of first, second and third transistors;
   (b) diode means having a predetermined reverse breakdown voltage connecting said signal developing means to said first transistor to thereby render it conductive in response to said signal;
   (c) means interconnecting said first, second and third transistors whereby said second and third transistors are rendered conductive in response to the conduction of said first transistor; and,
   (d) latch circuit means innerconnecting said second and third transistors to provide a holding current to said third transistor.

4. An overvoltage protection circuit for a circuit array comprised of one or more semiconductor devices each having anode, cathode and gate electrodes, said array being connected intermediate a source of electrical power and a load and serving, upon the application of gating pulses to the gate electrodes, to deliver electrical power from the source to the load, said overvoltage protection circuit comprising:
   (a) means connected across said circuit array for providing a unidirectional current as a result of the instantaneous voltage existing across the circuit array by virtue of the array's connection to the source of power;
   (b) charge storage means;
   (c) means for delivering said current to such charge storage mean whereby an electrical charge is developed and stored therein;
   (d) means for limiting the magnitude of said electrical charge;
   (e) signal developing means responsive to said current to develop a signal proportional thereto; and,
   (f) switch means responsive to a predetermined magnitude of said signal for discharging said charge storage means to thereby generate a gating signal for application to the gate electrodes of each semiconductor device of the array to thereby render each such device capable of conduction.

5. The invention in accordance with claim 4 wherein said means for limiting the magnitude for said charge includes a diode having a predetermined reverse breakdown voltage connected in a basically parallel relationship with said capacitor.

6. The invention in accordance with claim 5 wherein said diode is a Zener diode.

7. The invention in accordance with claim 5 wherein said signal developing means comprises resistive means connected in series with said diode.

8. An overvoltage protection circuit for a plurality of series connected semiconductor devices comprising:
   (a) means to provide a unidirectional current proportional to the instantaneous voltage across the series connected semiconductor devices;
   (b) means including charge storage means responsive to said unidirectional current to develop a charge of a predetermined magnitude;
   (c) means responsive to said unidirectional current to develop a control signal proportional to the instantaneous voltage across the semiconductor devices; and,
   (d) switch means responsive to said control signal operative to discharge said charge storage means to thereby develop a firing signal for rendering each of said semiconductor devices conductive.

9. An overvoltage protection circuit for a plurality of series connected semiconductor devices, each having a gate electrode, adapted to be rendered conductive by single firing pulse operative to apply simultaneous gating pulses to the individual gate electrodes of the semiconductor devices comprising:

(a) means to provide a unidirectional current proportional to the instantaneous voltage across the series connected semiconductor devices;

(b) charge storage means responsive to said unidirectional current to develop an electrical charge of a predetermined magnitude;

(c) means responsive to said unidirectional current to develop a control signal proportional to the instantaneous voltage across the semiconductor devices; and, (d) switch means, responsive to said control signal, operative to discharge said charge storage means to thereby develop a firing signal for rendering of said semiconductor devices conductive.

* * * * *